(12) United States Patent
Wang

(10) Patent No.: US 8,836,406 B2
(45) Date of Patent: Sep. 16, 2014

(54) VOLTAGE LEVEL SHIFTER

(71) Applicant: Meng Wang, Tianjin (CN)

(72) Inventor: Meng Wang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/176,136

(22) Filed: Feb. 9, 2014

(65) Prior Publication Data

US 2014/0152352 A1 Jun. 5, 2014

Related U.S. Application Data

(63) Continuation-in-part of application No. 13/605,985, filed on Sep. 6, 2012, now Pat. No. 8,686,784.

(30) Foreign Application Priority Data

Mar. 13, 2013 (CN) .......................... 2013 1 0168850

(51) Int. Cl.
*H03L 5/00* (2006.01)
*H03K 3/356* (2006.01)

(52) U.S. Cl.
CPC ............ *H03L 5/00* (2013.01); *H03K 3/356113* (2013.01)
USPC ....................................................... 327/333

(58) Field of Classification Search
None
See application file for complete search history.

(56) References Cited

U.S. PATENT DOCUMENTS

| | | | |
|---|---|---|---|
| 4,486,670 A | 12/1984 | Chan | |
| 4,978,870 A | 12/1990 | Chen | |
| 5,666,070 A * | 9/1997 | Merritt et al. | 326/81 |
| 5,821,800 A | 10/1998 | Le | |
| 6,222,384 B1 | 4/2001 | Kim | |
| 6,954,100 B2 | 10/2005 | Dharne | |
| 7,002,371 B2 | 2/2006 | Kase | |
| 7,009,424 B2 | 3/2006 | Khan | |
| 7,061,299 B2 | 6/2006 | Khan | |
| 7,382,158 B2 | 6/2008 | Kimura | |
| 7,397,297 B2 | 7/2008 | Kimura | |
| 7,443,223 B2 | 10/2008 | Bajkowski | |
| 7,446,566 B1 | 11/2008 | Chrudimsky | |
| 7,501,876 B2 | 3/2009 | Kimura | |
| 7,683,668 B1 | 3/2010 | Thakur | |
| 7,746,148 B2 * | 6/2010 | Hsu | 327/333 |
| 7,777,522 B2 | 8/2010 | Yang | |
| 7,808,294 B1 * | 10/2010 | Kottapalli | 327/333 |
| 7,893,730 B2 * | 2/2011 | Jung et al. | 327/108 |
| 7,994,819 B2 * | 8/2011 | Al-Shyoukh et al. | 326/68 |
| 8,604,868 B2 * | 12/2013 | Ucciardello et al. | 327/536 |
| 8,643,425 B2 * | 2/2014 | Chaudhry et al. | 327/333 |
| 2005/0285658 A1 * | 12/2005 | Schulmeyer et al. | 327/333 |
| 2006/0012415 A1 * | 1/2006 | Chen | 327/333 |

(Continued)

*Primary Examiner* — Lincoln Donovan
*Assistant Examiner* — Khareem E Almo
(74) *Attorney, Agent, or Firm* — Charles Bergere

(57) ABSTRACT

A level shifter includes a latch supplied at a first voltage $V_{DD1}$. First and second switches are connected in series with first and second latches and are cross-coupled to maintain the state of the latches during a stability period. A controller responds to a change of state of an input signal at a voltage different from the first voltage at an end of the stability period to deactivate both the first and second switches, to cause third and fourth switches to deactivate both the first and second latches during a transition period, and subsequently to change the state of the latch and maintain the changed state during the subsequent stability period. This avoids undesirable compromise between current consumption and transfer delay, as in a conventional level shifter.

8 Claims, 3 Drawing Sheets

(56) References Cited

U.S. PATENT DOCUMENTS

| | | | |
|---|---|---|---|
| 2007/0085566 A1* | 4/2007 | Koto et al. | 326/80 |
| 2007/0236847 A1* | 10/2007 | Jiang et al. | 361/91.5 |
| 2008/0224755 A1* | 9/2008 | Jo | 327/333 |
| 2008/0252354 A1* | 10/2008 | Koto et al. | 327/321 |
| 2010/0026361 A1* | 2/2010 | Jung et al. | 327/333 |
| 2011/0037509 A1* | 2/2011 | Herzer et al. | 327/333 |
| 2011/0069563 A1* | 3/2011 | Castaldo et al. | 365/189.11 |
| 2011/0074485 A1* | 3/2011 | Yamamoto | 327/333 |
| 2012/0146988 A1* | 6/2012 | Tsuchi | 345/212 |
| 2012/0274382 A1* | 11/2012 | Ucciardello et al. | 327/333 |
| 2012/0313666 A1* | 12/2012 | Thomas | 327/94 |
| 2012/0313667 A1* | 12/2012 | Thomas | 327/94 |
| 2012/0313670 A1* | 12/2012 | Thomas | 327/109 |
| 2013/0154713 A1* | 6/2013 | Wang | 327/333 |
| 2013/0241624 A1* | 9/2013 | Olson et al. | 327/333 |
| 2014/0002140 A1* | 1/2014 | Wang | 327/108 |

* cited by examiner

VOLTAGE LEVEL SHIFTER

CROSS-REFERENCE TO RELATED APPLICATION

This application is a continuation-in-part of U.S. patent application Ser. No. 13/605,985 filed Sep. 6, 2012 and assigned to Freescale Semiconductor, Inc.

BACKGROUND OF THE INVENTION

The present invention is directed to digital electronic circuits and, more particularly, to a voltage level shifter.

A semiconductor device, such as an integrated circuit (IC) may operate using more than one power supply voltage. For example, a semiconductor device may have internal modules having different functions and using different power supply voltages. The signal level at an input/output terminal of the semiconductor device that is connected to an external module may be determined for compatibility with the characteristics of the connected module and require a power supply voltage different from that for the internal modules. A level shifter, sometimes also referred to as a level translator, is a widely used circuit that is to convert signal levels to a higher or lower voltage.

Two key parameters of a level shifter are its current and power consumption, and its transfer delay (the delay between a change in the input signal and a corresponding change in the output signal). The supply voltage for a level shifter is high, often being the highest voltage in the IC, making low current consumption a particularly important parameter for low power consumption. Transfer delay is also important, especially in some gate driver applications that need fast turning on time. These parameters tend to be conflicting and known level shifters represent a compromise between these two parameters. It is desirable to provide a level shifter with low current consumption and also high transfer speed.

BRIEF DESCRIPTION OF THE DRAWINGS

The present invention is illustrated by way of example and is not limited by embodiments thereof shown in the accompanying drawings, in which like references indicate similar elements. Elements in the drawings are illustrated for simplicity and clarity and have not necessarily been drawn to scale.

DETAILED DESCRIPTION OF THE INVENTION

Figure 1:
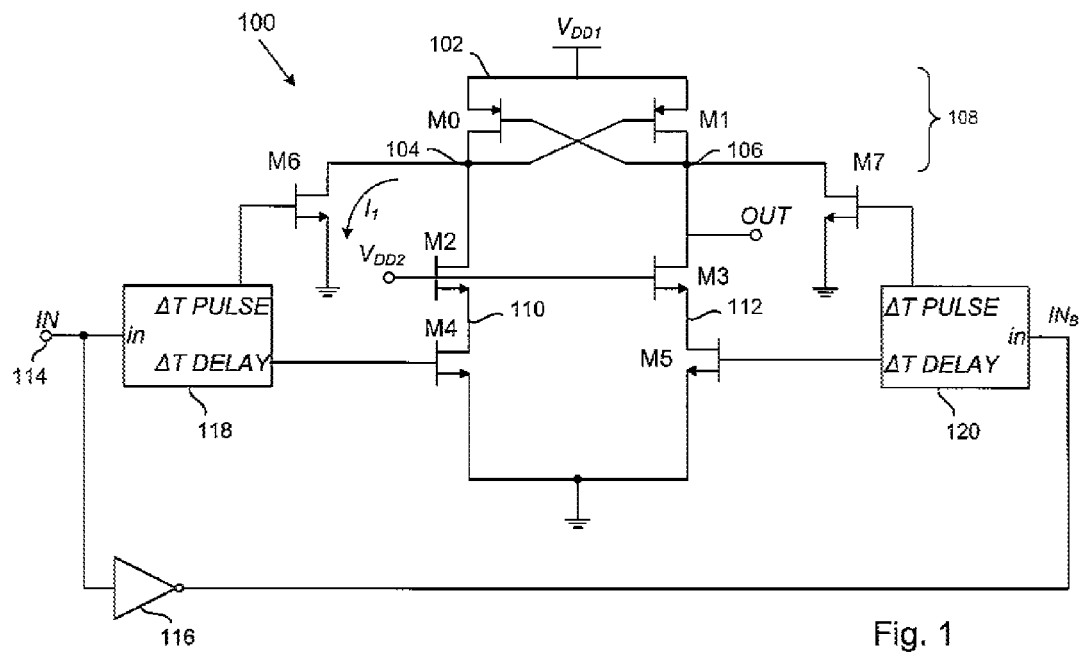
FIG. 1 is a schematic circuit diagram of a Level shifter.

The examples of level shifters described below and shown in the drawings are shown with positive supply voltages relative to ground and corresponding polarities of semiconductor devices. It will be appreciated that the level shifters may have negative supply voltages and/or supply relative to a voltage other than ground. Also, the level shifters described below and shown in the drawings provide an output signal at a voltage greater than the input signal but it is possible to provide an output signal at a voltage less than the input signal. Moreover the level shifters may be adapted to provide output signals at more than one voltage. Additionally, the level shifters are shown with a single output but it will be appreciated that the level shifters may have complementary outputs.

FIG. 1 shows a level shifter 100 as described in U.S. patent application Ser. No. 13/605,985 filed Sep. 6, 2012 and assigned to Freescale Semiconductor, Inc. The level shifter 100 has p-type complementary metal-oxide semiconductor (CMOS) transistors M0 and M1 whose sources are connected to a positive supply rail 102 at a voltage $V_{DD1}$ and whose drains are connected to nodes 104 and 106 respectively. The CMOS transistors M0 and M1 are cross-coupled by connection of their gates to the nodes 106 and 104 respectively, their gates thus being connected to the drain of the other of the CMOS transistor M0 and M1. The source-drain paths of the cross-coupled CMOS transistors M0 and M1 form first and second branches of a latch 108.

The level shifter 100 also has first and second series connections between the nodes 104 and 106 respectively and ground. The first and second series connections include first and second biased n-type CMOS transistors M2 and M3 and first and second n-type switch CMOS transistors M4 and M5 in series with the first and second branches respectively. The drains of the biased CMOS transistors M2 and M3 are connected to the nodes 104 and 106 and their sources are connected to nodes 110 and 112. The drains of the transistors M4 and M5 are connected to the nodes 110 and 112 and their sources are connected to ground. The gates of the transistors M2 and M3 are biased at a voltage $V_{DD2}$, which is smaller than the supply voltage $V_{DD1}$. The output signal OUT is taken from the node 106 and its level varies between $V_{DD1}$ when asserted, which is greater than the voltage of the input signal IN, and 0V when de-asserted. It also is possible to provide a complementary output signal from the node 104. In one example of the level shifter 100, the voltage of the input signal IN is 3V when asserted, the voltage $V_{DD2}$ is 9V and the voltage $V_{DD1}$ is 40V.

The biased transistors M2 and M3 share the switching voltages with the switch transistors M4 and M5. When the switch transistor M4 or M5 is OFF the bias voltage at the gate of the transistor M2 or M3 prevents the voltage at the nodes 110 or 112 from rising above $V_{DD2}-V_{TH}$, where $V_{TH}$ is the threshold voltage of the transistors M2 and M3, enabling the use of a higher supply voltage $V_{DD1}$ and output voltage OUT than the breakdown voltages of the switch transistors M4 and M5 would otherwise permit. The level shifter 100 also has third and fourth switch elements M6 and M7 whose drain-source signal paths are connected in parallel with the first and second series connections respectively. The drains of the third and fourth switch transistors M6 and M7 are connected to the nodes 104 and 106 respectively and their sources are connected directly to ground, without passing through elements such as the biased transistors M2 or M3.

The level shifter 100 includes controller modules 118 and 120 receiving the input signal IN for activating the third switch element M6 during a transition period ΔT after assertion of the input signal IN to change the state of the latch 108, and for deactivating the third switch element M6 and activating the first switch element M4 to maintain the state of the latch 108 during a stability period T1 following the transition period ΔT. The controller modules 118 and 120 also activate the fourth switch element M7 during an inverse transition period ΔT after de-assertion of the input signal IN to change the state of the latch 108, and deactivate the fourth switch element M7 and activate the second switch element M5 to maintain the state of the latch 108 during a stability period T2 following the inverse transition period. The transition periods ΔT are shorter than the transition periods of a conventional level shifter where the input signal IN and inverted input signal IN are applied directly to the gates of the switch transistors such as M4 and M5.

The controller modules 118 and 120 provide control signals ΔTPULSE to the gates of the switch transistors M6 and M7 and control signals ΔTDELAY to the gates of the switch transistors M4 and M5 respectively. The voltages of the input signal IN and IN$_B$ and of the control signals ΔTPULSE and ΔTDELAY are less than the voltage V$_{DD2}$ when asserted and are equal to 0V (ground potential) when de-asserted in this example, although it will be appreciated that other voltages are possible.

Figure 2:
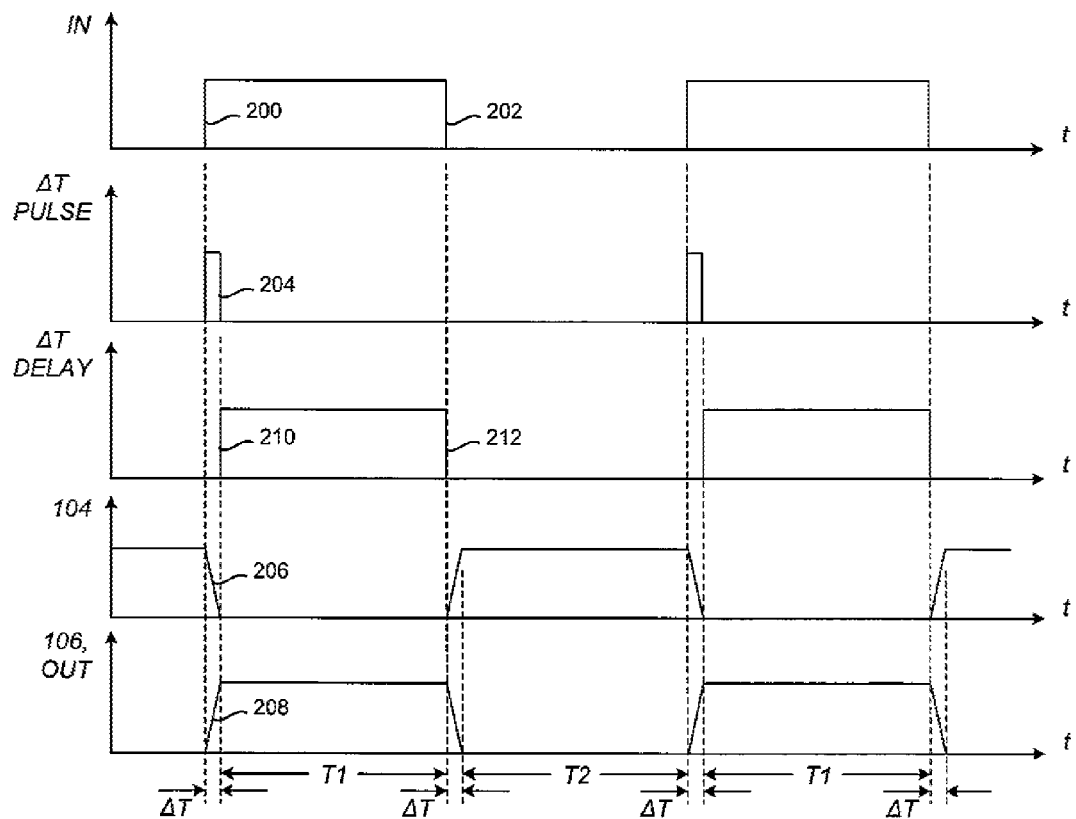
FIG. 2 is a timing chart of signals appearing in operation of the level shifter of FIG. 1.
Figure 3:
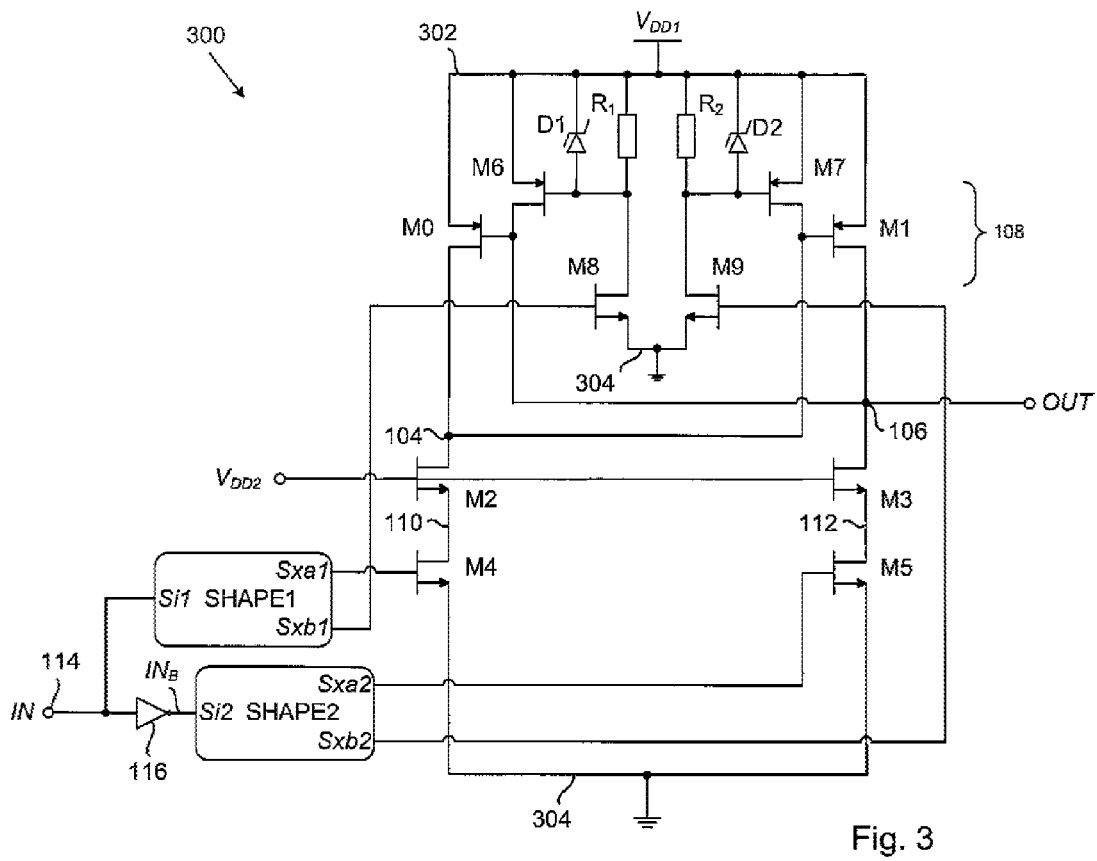
FIG. 3 is a schematic circuit diagram of a level shifter in accordance with one embodiment of the invention, given by way of example.

In operation, if the latch 108 of the level shifter 100 is initially in a state with the transistor M0 conducting, the node 104 is at the supply voltage V$_{DD1}$. The gate of the transistor M1 is at the same voltage V$_{DD1}$ and the transistor M1 is OFF. When the input signal IN is asserted and changes state from low to high, as shown in FIG. 2 at 200, the controller module 118 asserts the control signal ΔTPULSE at the gate of the switch transistor M6 as shown at 204 and turns the switch transistor M6 ON for a transition period of duration ΔT. The controller module 120 maintains the control signals ΔTPULSE and ΔTDELAY de-asserted at the gates of the switch transistor M5 and the switch transistor M7, which are OFF. The switch transistor M6 pulls the voltage of the node 104 directly down to ground as shown at 206. The transistor M1 is turned ON, pulling up the voltage of the node 106 and of the output signal OUT to the voltage V$_{DD1}$ as shown at 208. The voltage V$_{DD1}$ at the node 106 turns the transistor M0 OFF, reinforcing the change of state of the latch 108. The duration ΔT of assertion of the control signal ΔTPULSE is chosen to be as short as is compatible with ensuring the change of state of the latch 108.

At the end of the transition period ΔT, the controller module 118 de-asserts the control signal ΔTPULSE and asserts the control signal ΔTDELAY at the gate of the switch transistor M4 for a stability period of duration T1. The switch transistor M6 turns OFF and remains OFF until the controller module 118 asserts the control signal ΔTPULSE again. The switch transistor M4 turns ON and remains ON for the duration T1 of the stability period but does not have to sink a current from the transistor M0, which is already turned OFF. The stability period is defined by the cycle time of the input signal IN and the controller module 118 de-asserts the control signal ΔTDELAY at the falling edge 202 of the input signal IN, as shown at 212.

At the falling edge 202 of the input signal IN, when the input signal IN is de-asserted and changes state from high to low and the output IN$_B$ of the inverter 116 changes state from low to high, the controller module 120 asserts the control signal ΔTPULSE at the gate of the switch transistor M7, turns the switch transistor M7 ON for an inverse transition period of duration ΔT and reverses the state of the latch 108 during a stability period T2.

During the transition period ΔT, at the rising or falling edge 200 or 202 of the input signal IN, the transistor M0 or M1 has not yet been turned OFF, so that a substantial current I$_1$ can flow through the transistor M0 or M1 and the switch transistor M6 or M7. The duration of the transition period ΔT of change of state of the latch 108 can be made short, since the switch transistor M6 or M7 pulls the voltage of the node 104 or 106 rapidly down to ground without the intervening resistance of the biased transistor M2 or M3. The total current consumption of the level shifter 100 during a complete cycle of the input signal IN and the transition period ΔT can be reduced compared to a conventional level shifter. However, it is still desirable to reduce further the current consumption of the level shifter 100 and the transfer delay. Reducing the current consumption implies increasing the resistance of the drain-source signal paths of the third and fourth switch elements M6 and M7 which are connected in parallel with the first and second series connections respectively between the nodes 104 and 106 and ground. However, this would result in longer transfer times, meaning that a compromise still exists between the current consumption of the level shifter 100 and the transfer delay. It is desirable to avoid such a compromise.

FIGS. 3 to 6 illustrate an example of a level shifter 300, and a gate driver 600 including the level shifter 300, in accordance with an embodiment of the present invention. The level shifter 300 comprises a latch 108 supplied at a first voltage V$_{DD1}$ and having first and second latch elements M0 and M1 one of which is activated and the other deactivated in respective states of the latch 108. First and second switch elements M4 and M5 are connected in series with the first and second latch elements M0 and M1 and are coupled to maintain the state of the second and first latch elements M1 and M0 respectively during a stability period (T−dT). An output node 106 is connected to at least one of the first and second latch elements M0 and M1. Third and fourth switch elements M6, M8 and M7, M9 are connected to control the first and second latch elements M0 and M1 respectively during a transition period dT. A controller SHAPE1, SHAPE2 responds to a change of state of an input signal IN at a voltage different from the first voltage V$_{DD1}$ at an end of the stability period (T−dT) to deactivate both the first and second switch elements M4 and M5, to cause the third and fourth switch elements M6, M8 and M7, M9 to deactivate both the first and second latch elements M0 and M1 during the transition period dT, and subsequently to activate one of the first and second switch elements M4 and M5 and the corresponding one of the second and first latch elements M1 and M0 to change the state of the latch 108 and maintain the changed state during the subsequent stability period (T−dT).

The level shifter 300 may include first and second biased elements M2 and M3 connected in series between the first and second switch elements M4 and M5 and the first and second latch elements M0 and M1 respectively, the first and second biased elements M2 and M3 being biased by a second voltage V$_{DD2}$ which is smaller than the first voltage V$_{DD1}$.

The controller SHAPE1, SHAPE2 may comprise a capacitive timing element 502 defining a duration of the transition period dT. The capacitive timing element 502 may define a delayed signal SiD1, SiD2 triggered by the change of state of the input signal IN and define the duration of the transition period dT relative to a conjunction between the assertion/de-assertion of the input signal IN and the de-assertion/assertion of the delayed signal SiD1, SiD2.

The controller SHAPE1, SHAPE2 may comprise a gate element 504 defining a start of the stability period (T−dT) as a function of an end of the transition period dT. The gate element 504 may define an end of the stability period (T−dT) as a function of the change of state of the input signal IN.

The first and second latch elements M0 and M1 may have respective first and second current conduction paths in series with the first and second switch elements M4 and M5 and first and second control electrodes connected with the second and first switch elements M1 and M0 and with the third and fourth switch elements M6, M8 and M7, M9. The first voltage V$_{DD1}$ may be supplied between first and second voltage supply nodes 302 and 304, and the third and fourth switch elements M6, M8 and M7, M9 may include respectively third and fourth control elements M6 and M7 having control electrodes and current conduction paths connected between the first and second control electrodes and the first voltage supply node 302, and third and fourth drive elements M8 and M9 having current conduction paths connected between the control electrodes of the third and fourth control elements M6 and M7 and the second voltage supply node 304. The third and fourth switch elements M6, M8 and M7, M9 may include respective resistive elements $R_1$ and $R_2$ connected between the control electrodes of the third and fourth control elements M6 and M7 and the first voltage supply node 302 in series with the current conduction paths of the third and fourth drive elements M8 and M9.

The gate driver 600 may comprise a charge pump 602, a power transistor 606 having a gate electrode, and the level shifter 300. The charge pump 602 may supply power to the level shifter 300, and the output of the level shifter 300 may apply a voltage to the gate electrode of the power transistor.

In more detail, in this example of the level shifter 300, the first and second latch elements M0 and M1 of the latch 108 include the source-drain signal paths of p-type transistors whose sources are connected to the positive supply rail 302 at the voltage $V_{DD1}$ and whose drains are connected to nodes 104 and 106 respectively. The CMOS transistors M0 and M1 are cross-coupled by connection of their gates to the nodes 106 and 104 respectively, their gates thus being connected to the drain of the other CMOS transistor M1 and M0.

The biased elements M2 and M3 are CMOS n-type transistors, whose drains are connected to the nodes 104 and 106, and whose sources are connected to nodes 110 and 112. The first and second switch elements M4 and M5 are n-type CMOS transistors M4 and M5 whose drains are connected to the nodes 110 and 112 and whose sources are connected to the ground node 304. The gates of the transistors M2 and M3 are biased at the voltage $V_{DD2}$ which is smaller than the supply voltage $V_{DD1}$.

The third and fourth control elements M6 and M7 are p-type CMOS transistors whose sources are connected to the positive supply rail 302 and whose drains are connected to the gates of the first and second latch elements M0 and M1 of the latch 108. The third and fourth drive elements M8 and M9 are n-type CMOS transistors whose sources are connected to the ground node 304 and whose drains are connected to the gates of the third and fourth control elements M6 and M7. The resistors $R_1$ and $R_2$ connected in series between the positive supply rail 302 and the drains of the third and fourth drive elements M8 and M9 serve to limit their drain-source current, which in any case only flows during the short transition period dT. Zener diodes D1 and D2 are connected in parallel with the resistors $R_1$ and $R_2$ to limit the gate voltage applied across the drain-source junction of the control elements M6 and M7.

The level shifter 300 includes controller modules SHAPE1 and SHAPE2. An input of the controller module SHAPE1 is connected to a terminal 114 to receive the input signal IN and an input of the controller module SHAPE2 is connected to the terminal 114 through an inverter 116 to receive an inverted input signal $IN_B$. The controller modules SHAPE1 and SHAPE2 provide control signals Sxb1 and Sxb2 to the gates of the drive elements M8 and M9 and control signals Sxa1 and Sx2 to the gates of the switch elements M4 and M5 respectively. The voltages of the input signal IN and $IN_B$ and of the control signals Sxa1, Sx2 Sxb1 and Sxb2 are less than the voltage $V_{DD2}$ when asserted and are equal to 0V (ground potential) when de-asserted in this example, although it will be appreciated that other voltages are possible. The output signal OUT is taken from the node 106 and its level varies between $V_{DD1}$ when asserted, which is greater than the voltage of the input signal IN, and 0V when de-asserted. It is also possible to provide a complementary output signal from the node 104. In one example of the level shifter 300, the voltage of the input signal IN is 3.3V when asserted, the voltage $V_{DD2}$ is 9V and the voltage $V_{DD1}$ is 40V.

Figure 4:
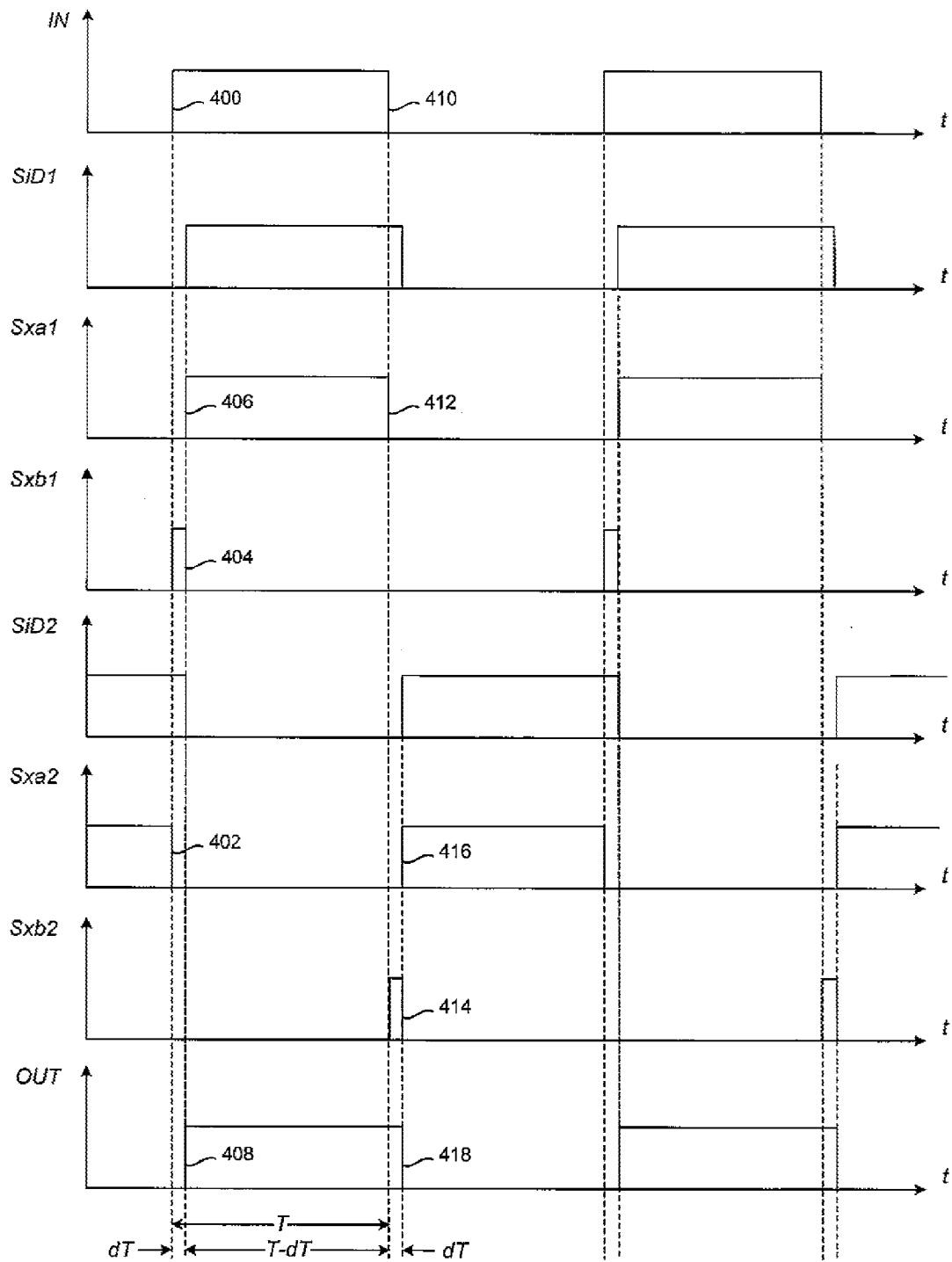
FIG. 4 is a timing chart of signals appearing in operation of the level shifter of FIG. 3.

In operation, if the latch 108 of the level shifter 300 is initially in a state with the latch element M0 and the switch element M5 ON (conducting), the node 104 is at the supply voltage $V_{DD1}$. The gate of the latch element M1 is at the same voltage $V_{DD1}$ and the latch element M1 and the switch element M4 are OFF. When the input signal IN is asserted and changes state from low to high, as shown in FIG. 4 at 400, the controller module SHAPE2 de-asserts the control signal Sxa2 as shown at 402, turning the switch element M5 OFF. Both the switch elements M4 and M5 are OFF and present no current path to the ground node 304.

The controller module SHAPE1 asserts the control signal Sxb1 at the gate of the drive element M8 as shown at 404 turning the drive element M8 ON. The gate of the control element M6 is pulled down towards ground, turning the control element M6 ON for the transition period of duration dT. The control element M6 pulls the gate of the latch element M0 up to the supply voltage $V_{DD1}$, turning the latch element M0 OFF. Both the latch elements M0 and M1 are OFF and present no current path to the voltage supply node 302. The duration dT of assertion of the control signal Sxb1 is chosen to be as short as is compatible with the turn-on time of the transistors, to ensure the change of state of the latch 108, so that the flow of current in the drive element M8 is limited in time and is also limited in magnitude by the resistor R1 to that necessary to change the gate voltage of, and turn ON, the control element M6. The flow of current in the drive element M6 is similarly limited in time and limited in magnitude to that necessary to turn OFF the latch element M0. There is no need for compromise between current consumption and transfer delay, as in a conventional level shifter.

At the end of the transition period dT, the controller module SHAPE1 de-asserts the control signal Sxb1 and asserts the control signal Sxa1 at the gate of the switch element M4 as shown at 406. The drive and control elements M8 and M6 turn OFF and remain OFF until the controller module SHAPE1 asserts the control signal Sxb1 again at the start of the next full latch cycle. The switch element M4 turns ON and remains ON for the duration (T−dT) of the stability period but does not have to sink any current from the transistor M0, which is already turned OFF. The switch element M4 turning ON pulls the voltage of the node 104 down towards ground through the node 110 and the biased element M2, turning ON the latch element M1. The latch element M1 pulls up the voltage of the node 106 and of the output signal OUT to the voltage $V_{DD1}$ as shown at 408. The voltage $V_{DD1}$ at the node 106 keeps the latch element M0 OFF, reinforcing and maintaining the change of state of the latch 108. The stability period (T−dT) is defined by the half-cycle time of the input signal IN and the controller module SHAPE1 de-asserts the control signal Sxa1 at the falling edge 402 of the input signal IN, as shown at 412.

During the following half-cycle of the input signal IN, after the falling edge 410 of the input signal IN, the output $IN_B$ of the inverter 116 changes state from low to high, the controller module SHAPE1 de-asserting the control signal Sxa1 as shown at 412, turning the switch element M4 OFF. Both the switch elements M4 and M5 are OFF and present no current path to the ground node 304. The controller module SHAPE2 asserts the control signal Sxb2 at the gate of the drive element M9, as shown at 414, turning the drive element M9 ON for the inverse transition period of duration dT. The gate of the control element M7 is pulled down towards ground, turning the control element M7 ON for the transition period of duration dT. The control element M7 pulls the gate of the latch element M1 up to the supply voltage $V_{DD1}$, turning the latch element M1 OFF. Both the latch elements M1 and M0 are OFF and present no current path to the voltage supply node 302. At the end of the transition period dT, the controller module SHAPE2 de-asserts the control signal Sxb2 and asserts the control signal Sxa2 at the gate of the switch element M5 as shown at 416. The drive and control elements M9 and M7 turn OFF and remain OFF until the controller module SHAPE2 asserts the control signal Sxb2 again at the start of the next full inverse latch cycle. The switch element M5 turns ON and remains ON for the duration (T−dT) of the stability period. The switch element M5 turning ON pulls the voltage of the node 106 and of the output signal OUT down towards ground through the node 112 and the biased element M3, as shown at 418, turning ON the latch element M0. The latch element M0 pulls up the voltage of the node 104 to the voltage $V_{DD1}$. The voltage $V_{DD1}$ at the node 104 keeps the latch element M1 OFF, reinforcing and maintaining the change of state of the latch 108.

Simulation data for examples of the level shifters confirm the improvement in the characteristics of the level shifter 300 compared to the level shifter 100. During the transition period dT, the current consumption of an example of the level shifter 100 was 5.6 μA, compared to 2.1 μA for an example of the level shifter 300 with otherwise similar components and the transition time of the example of the level shifter 100 was 16 ns, compared to 1.9 ns for the example of the level shifter 300.

Figure 5:
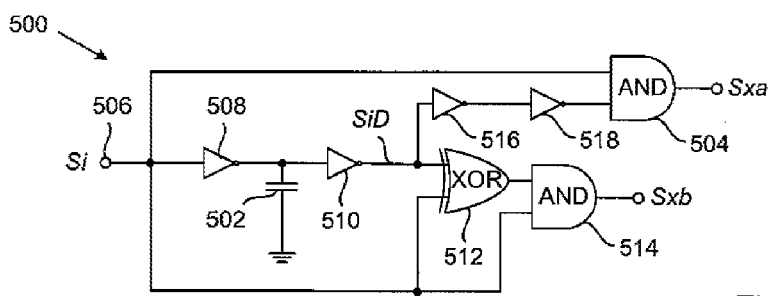
FIG. 5 is a schematic circuit diagram of a controller of the level shifter of FIG. 3.

FIG. 5 shows an example 500 of an embodiment of the controller modules SHAPE1 and SHAPE 2. The controller module 500 receives an input signal Si at a terminal 506, which is the input signal IN from the terminal 114 or the inverted input signal $IN_B$ from the inverter 116, and produces output signals Sxa and Sxb, which are the control signals Sxa1 or Sxa2 and Sxb1 or Sxb2. The input signal Si is applied through an inverter 508 to the capacitor 502, which is connected across the input of an inverter 510. The output of the inverter 510 is a signal SiD, which is the signal SiD1 or SiD2, delayed relative to the input signal Si, being triggered by the changes in state of the input signal Si.

The delayed signal SiD is applied to one input of a gate 512, which is an XOR gate in this example, and which receives the input signal Si from the terminal 506 on its other input. The output of the XOR gate 512 is asserted when either but not both of the input signal Si and the delayed signal SiD is asserted. The output of the XOR gate 512 is applied to one input of an AND gate 514 which receives the input signal Si from the terminal 506 on its other input. The output of the AND gate 514 is the output signal Sxb which is asserted during the conjunction between the assertion of the input signal Si and the de-assertion of the delayed signal SiD and defines the duration of the transition period dT.

The delayed signal SiD is applied through buffer inverters 516 and 518 to one input of the gate 504, which is an AND gate in this example, and which receives the input signal Si from the terminal 506 on its other input. The output of the AND gate 504 is the output signal Sxa which is asserted during the conjunction between the assertion of the input signal Si and the assertion of the delayed signal SiD and defines the duration of the stability period (T−dT). The start of the stability period (T−dT) is thus defined as a function of an end of the transition period dT, when the delayed signal SiD is asserted.

Figure 6:
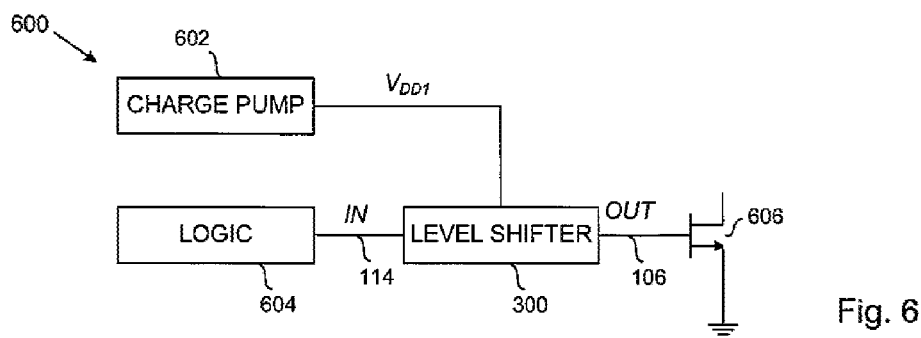
FIG. 6 is a schematic block diagram of a gate driver including the level shifter of FIG. 3, given by way of example.

FIG. 6 illustrates an example of a high voltage gate driver 600 including the level shifter 300. The gate driver is powered by a charge pump 602 at the voltage $V_{DD1}$. A logic circuit 604 applies to the input 114 of the level shifter 300 the input signal IN varying between ground and a voltage less than $V_{DD2}$. The output 106 of the level shifter 300 provides a drive voltage for the gate of a high voltage metal-oxide field-effect (MOSFET) power transistor 606. The current consumption of the level shifter affects the voltage $V_{DD1}$ that the charge pump 602 supplies and hence the ON resistance $R_{DSON}$ of the MOSFET 606. The impact of the current consumption of the level shifter 300 on the ON resistance $R_{DSON}$ of the MOSFET 606 is considerably less than the impact of a conventional level shifter would be and the transfer delay is faster.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A level shifter, comprising:
a latch supplied at a first voltage and having first and second latch elements one of which is activated and the other deactivated in respective states of said latch;
first and second switch elements connected in series with said first and second latch elements and coupled to maintain the state of said second and first latch elements respectively during a stability period;
an output connected to at least one of said first and second latch elements;
third and fourth switch elements connected to control said first and second latch elements respectively during a transition period, wherein said first and second latch elements have respective first and second current conduction paths in series with said first and second switch elements and first and second control electrodes connected with said second and first switch elements and with said third and fourth switch elements, wherein said first voltage is supplied between first and second voltage supply nodes, and said third and fourth switch elements include respective third and fourth control elements having control electrodes and current conduction paths connected between said first and second control electrodes and said first voltage supply node, and third and fourth drive elements having current conduction paths connected between said control electrodes of said third and fourth control elements and said second voltage supply node; and
a controller for responding to a change of state of an input signal at a voltage different from said first voltage at an end of said stability period to deactivate both said first and second switch elements, to cause said third and fourth switch elements to deactivate both said first and second latch elements during said transition period, and subsequently to activate one of said first and second switch elements and the corresponding one of said second and first latch elements to change the state of said latch and maintain the changed state during the subsequent stability period.

2. The level shifter of claim 1, further comprising first and second biased elements connected in series between said first and second switch elements and said first and second latch elements respectively, said first and second biased elements being biased by a second voltage that is less than said first voltage.

3. The level shifter of claim 1, wherein said controller comprises a capacitive timing element that defines a duration of said transition period.

4. The level shifter of claim 3, wherein said capacitive timing element defines a delayed signal triggered by said change of state of said input signal and defines said duration of said transition period relative to a conjunction between assertion/de-assertion of said input signal and de-assertion/assertion of said delayed signal.

5. The level shifter of claim 1, wherein said controller comprises a gate element defining a start of said stability period as a function of an end of said transition period.

6. The level shifter of claim 5, wherein said gate element defines an end of said stability period as a function of said change of state of said input signal.

7. The level shifter of claim 1, wherein said third and fourth switch elements include respective resistive elements connected between said control electrodes of said third and fourth control elements and said first voltage supply node in series with said current conduction paths of said third and fourth drive elements.

8. A gate driver, comprising:
a charge pump;
a power transistor having a gate electrode; and
a level shifter, including,
a latch supplied at a first voltage and having first and second latch elements one of which is activated and the other deactivated in respective states of said latch,
first and second switch elements connected in series with said first and second latch elements and coupled to maintain the state of said second and first latch elements respectively during a stability period;
an output connected to at least one of said first and second latch elements,
third and fourth switch elements connected to control said first and second latch elements respectively during a transition period, and
a controller for responding to a change of state of an input signal at a voltage different from said first voltage at an end of said stability period to deactivate both said first and second switch elements, to cause said third and fourth switch elements to deactivate both said first and second latch elements during said transition period, and subsequently to activate one of said first and second switch elements and the corresponding one of said second and first latch elements to change the state of said latch and maintain the changed state during the subsequent stability period,
wherein said charge pump supplies power to said level shifter, and said output of said level shifter applies a voltage to said gate electrode of said power transistor.

* * * * *